US007164584B2

(12) United States Patent
Walz

(10) Patent No.: US 7,164,584 B2
(45) Date of Patent: Jan. 16, 2007

(54) MODULAR HEATSINK, ELECTROMAGNETIC DEVICE INCORPORATING A MODULAR HEATSINK AND METHOD OF COOLING AN ELECTROMAGNETIC DEVICE USING A MODULAR HEATSINK

(75) Inventor: Andrew A. Walz, Toronto (CA)

(73) Assignee: Honeywell International Inc., Morristown, NJ (US)

(*) Notice: Subject to any disclaimer, the term of this patent is extended or adjusted under 35 U.S.C. 154(b) by 311 days.

(21) Appl. No.: 10/968,750

(22) Filed: Oct. 19, 2004

(65) Prior Publication Data

US 2006/0082945 A1 Apr. 20, 2006

(51) Int. Cl.
*H05K 7/20* (2006.01)
*H01F 27/08* (2006.01)

(52) U.S. Cl. ...................... 361/704; 361/709; 361/710; 165/80.3; 165/185; 336/55

(58) Field of Classification Search ..................... None
See application file for complete search history.

(56) References Cited

U.S. PATENT DOCUMENTS 3,659,239 A 4/1972 Marton
3,961,666 A * 6/1976 Suzuki et al. ............... 165/129
4,928,138 A 5/1990 Walton et al.
5,210,513 A 5/1993 Khan et al.
5,469,124 A 11/1995 O'Donnell et al.
5,479,146 A 12/1995 Herbert
5,594,317 A 1/1997 Yeow et al.
5,600,222 A 2/1997 Hall et al.
5,656,984 A 8/1997 Paradis et al.
5,771,966 A * 6/1998 Jacoby ....................... 165/185
5,791,406 A * 8/1998 Gonner et al. .............. 165/185
5,889,450 A 3/1999 Kim et al.
5,964,285 A * 10/1999 Huang ........................ 165/185
6,087,916 A 7/2000 Kutkut et al.
6,185,811 B1 2/2001 Perry
6,202,738 B1 * 3/2001 Tanaka et al. ............. 165/80.3
6,259,347 B1 7/2001 Sines
6,278,353 B1 8/2001 Downing et al.
6,315,032 B1 * 11/2001 Lee et al. .................. 165/80.3
6,492,890 B1 12/2002 Wozniczka
6,563,410 B1 5/2003 Marton
2002/0070831 A1 6/2002 Harding
2004/0004527 A1 1/2004 Geller et al.
2004/0080393 A1 4/2004 Phadke
2006/0050485 A1 * 3/2006 Chin .......................... 361/719

* cited by examiner

*Primary Examiner*—Boris Chervinsky
(74) *Attorney, Agent, or Firm*—Birch, Stewart, Kolasch & Birch, LLP

(57) ABSTRACT

An electromagnetic device (10) includes a core (12) having first and second arms (16, 18) connected by at least one body (14), a first winding (40) having multiple turns (41*a*, 41*b*) on the first arm (16) and a second winding (42) having multiple turns (43*a*, 43*b*) on the second arm (18), and a heatsink (50) having a first plurality of U-shaped heatsink elements (52) each including first and second legs (56, 58) aligned with the first and second arms (16, 18) and having a first thickness connected by a base (54) having a second thickness greater than the first thickness, the base (54) of each of the plurality of elements (52) being in contact with the base (54) of an adjacent heatsink element (52).

26 Claims, 5 Drawing Sheets

MODULAR HEATSINK, ELECTROMAGNETIC DEVICE INCORPORATING A MODULAR HEATSINK AND METHOD OF COOLING AN ELECTROMAGNETIC DEVICE USING A MODULAR HEATSINK

FIELD OF THE INVENTION

The present invention is directed to a modular heatsink, an electromagnetic device incorporating a modular heatsink and a method of cooling an electromagnetic device using a modular heatsink, and, more specifically, to a heatsink comprising a plurality of generally U-shaped heatsink elements adapted to extend between the core and windings or between adjacent winding turns of an electromagnetic device, an electromagnetic device incorporating these heatsink elements, and a method of cooling an electromagnetic device using such heatsink elements.

BACKGROUND OF THE INVENTION

Many electromagnetic devices generate heat during use and require cooling to prevent the temperature of the device and/or surrounding environment from becoming too high. Certain devices, including transformers and inductors, include current carrying windings, and heat generated in these windings must be dissipated. However, because the windings are often tightly wound and may be coated with an insulating material, heat generated internally must either transfer across several layers of insulation, travel through the core material (which may exhibit poor thermal conductivity) or along the winding conductive path and into the wiring or bussing connected to the device. None of these heat flow paths are particularly efficient.

Heat dissipation becomes increasingly important when electromagnetic devices operate at high power levels. High temperatures generated by these devices limit the power levels at which they can operate. Such temperature limits thus may also adversely affect the volumetric and weight performance of equipment incorporating the electromagnetic devices. This is especially true in high power density equipment operating in high ambient temperature or in applications where active cooling is required, such as in aerospace applications. Heatsinks are known for cooling electronic equipment, but are generally only useful for removing heat from exposed surfaces of a device. It is therefore desirable to provide a heatsink that can conduct heat outwardly from an inner portion of a heat generating device.

SUMMARY OF THE INVENTION

These issues and others are addressed by the present invention which comprises, in a first aspect, a heatsink that includes a plurality of U-shaped heatsink elements each having first and second legs of a first thickness connected by a base of a second thickness greater than the first thickness, the base of each of the heatsink elements being in contact with the base of an adjacent heatsink element.

Another aspect of the invention comprises a method of cooling an electromagnetic device that has a core with first and second arms connected by a body and a first winding having multiple turns around the first arm and a second winding having multiple turns around the second arm. The method involves using a plurality of heatsink elements each having a base of a first thickness and first and second legs of a second thickness less than the first thickness extending from the base. A first one of these elements is arranged with a first leg between the first arm of the core and a portion of the first winding and the second leg between the second arm of the core and a portion of the second winding. A second one of the heatsink elements is arranged with its first leg between a first and a second turn of the first winding and its second leg between a first and a second turn of the second winding. The bases of the heatsink elements are then held in thermal contact.

A further aspect of the invention comprises an electromagnetic device that includes a core with first and second arms connected by at least one body and a first winding, comprising multiple turns, on the first arm and a second winding, comprising multiple turns, on the second arm. The heatsink comprises a first plurality of U-shaped heatsink elements each having first and second legs aligned with the first and second arms and connected by a base, the base being thicker than the legs, the base of each of the elements being in contact with the base of an adjacent element.

An additional aspect of the invention comprises a heatsink that includes a plurality of U-shaped heatsink elements each having first and second legs connected by a base and a plurality of spacers spacing the base of each heatsink element from the base of an adjacent heatsink element. The spacers leave a gap between the first leg of each heatsink element and the first leg of an adjacent heatsink element. The base of each of the plurality of heatsink elements is in thermal contact with the base of each adjacent heatsink element through the spacers.

BRIEF DESCRIPTION OF THE DRAWINGS

These and other aspects and advantages of the present invention will be better understood after a consideration of the following detailed description of embodiments of the invention and the following drawings wherein.

DETAILED DESCRIPTION

Figure 1:
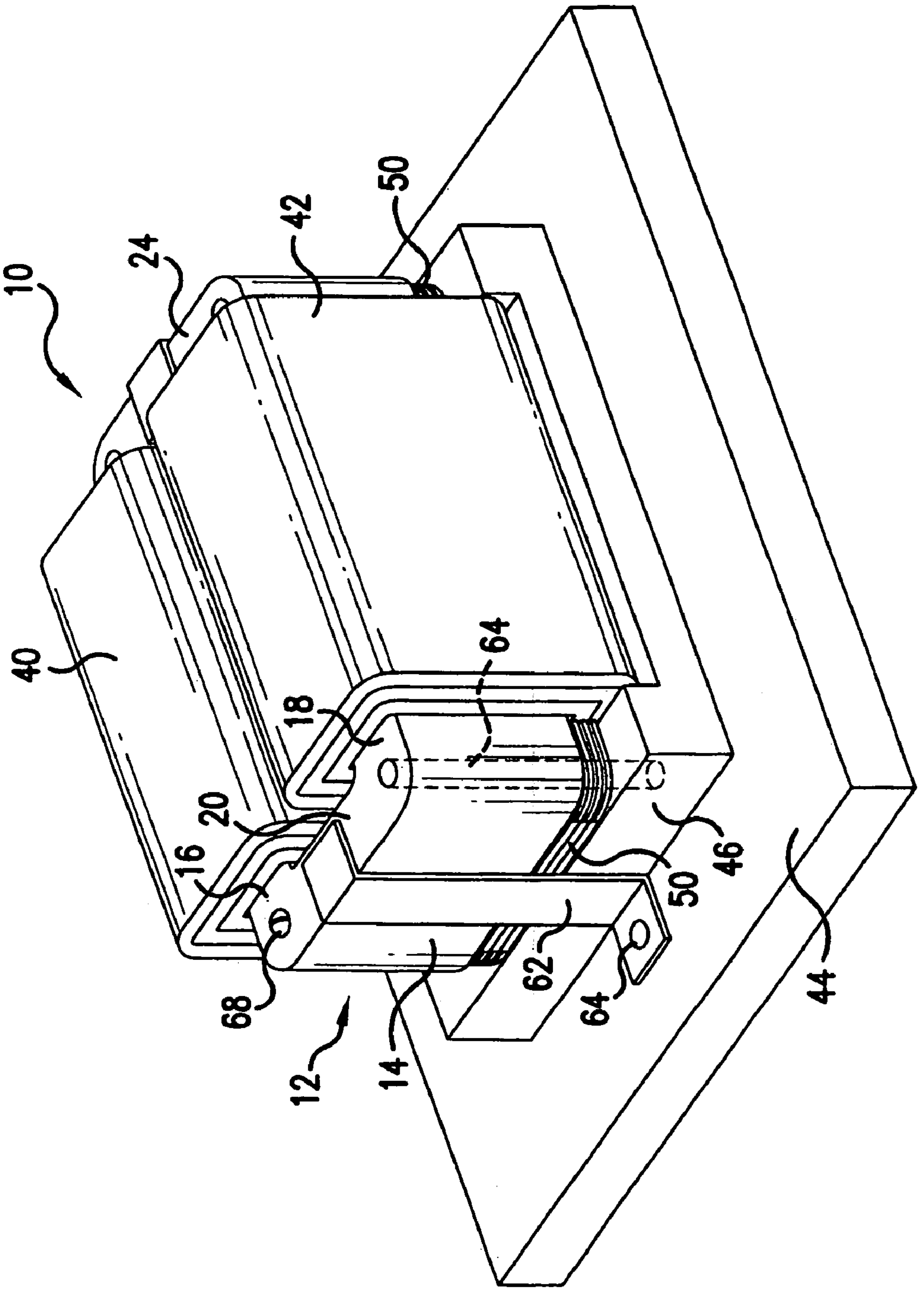
FIG. 1 is a perspective view of an electromagnetic device incorporating two heatsinks according to an embodiment of the present invention.
Figure 5:
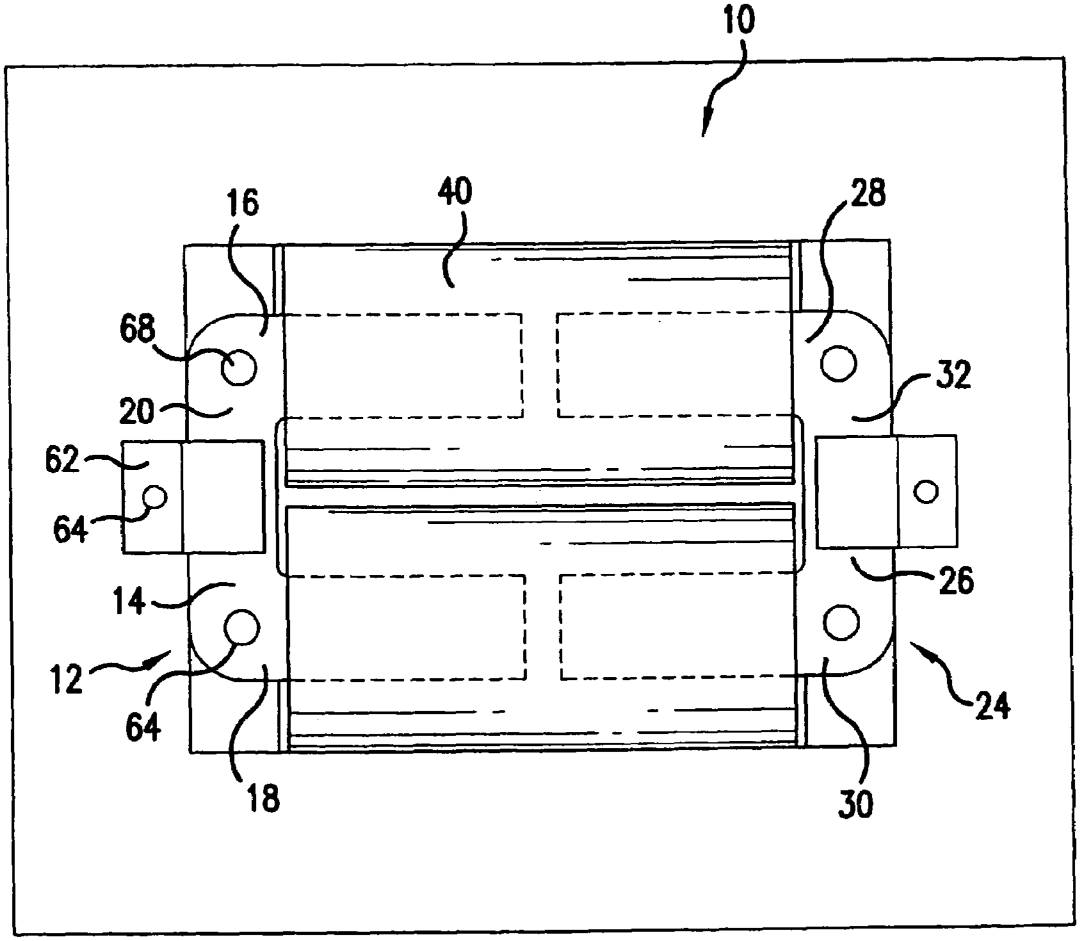
FIG. 5 is a top plan view of the electromagnetic device of FIG. 1.
Figure 6:
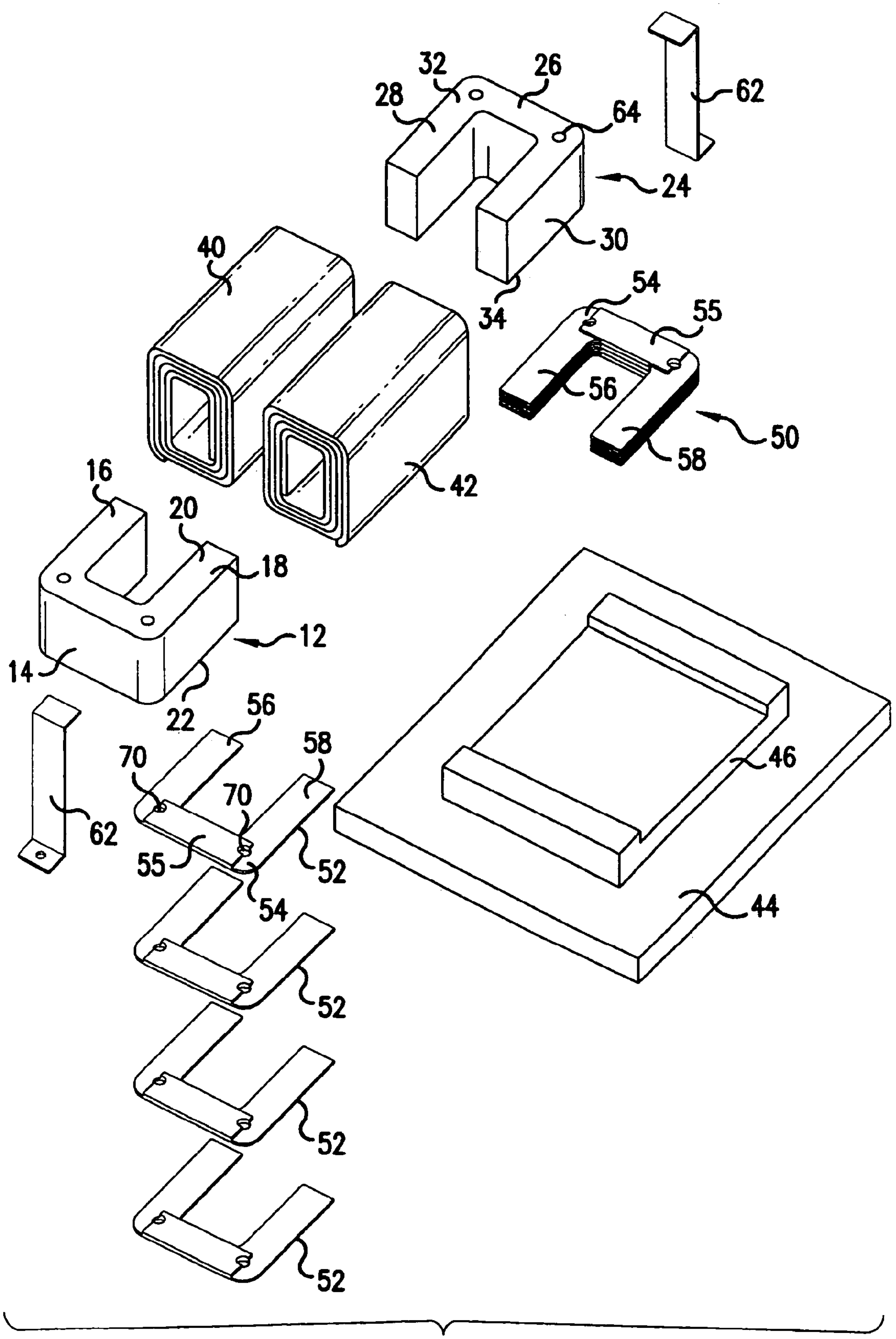
FIG. 6 is an exploded perspective view of the electromagnetic device of FIG. 1.

Referring now to the drawings, wherein the showings are for the purpose of illustrating embodiments of the invention only and not for the purpose of limiting same, FIGS. 1, 5 and 6 show an electromagnetic device 10, which may be, for example, a transformer or inductor, comprising a first core element 12 having a body portion 14 and a first arm 16 and second arm 18 extending therefrom, the first core element 12 including a top 20 and bottom 22 ("top" and "bottom" being used with reference to the orientation of device 10 in FIG. 1). Electromagnetic device 10 further includes a second core element 24 having a body portion 26 and a first arm 28 and second arm 30 extending therefrom, the second core element 24 including a top 32 and bottom 34. First and second core elements 12, 24 are illustrated as being separated by a gap but could alternately be in contact with one another or comprise opposite ends of a single core element depending on the nature of the electromagnetic device 10.

A first winding 40, comprising a number of turns, including turns 41*a* and 41*b*, is supported by first core element first arm 16 and second core element first arm 28 and a second winding 42, comprising a number of turns, including turns 42*a* and 42*b*, is supported by first core element second arm 18 and second core element second arm 30. The windings 40, 42 are electrically connected to sources of power and/or loads in a well known manner based upon the application of the electromagnetic device 10.

Electromagnetic device 10 is shown mounted on a support 44 which includes a raised platform 46 for spacing windings 40, 42 from support 44. Support 44 will generally perform a heatsink function, either by having sufficient mass to absorb and dissipate heat or by having internal cooling conduits or another active cooling arrangement. The particular nature of support 44 is not important as long as it has the ability to absorb and dissipate heat that flows conductively thereinto. It may, for example, comprise a portion of the chassis of the device in which the electromagnetic device is used.

Figure 7:
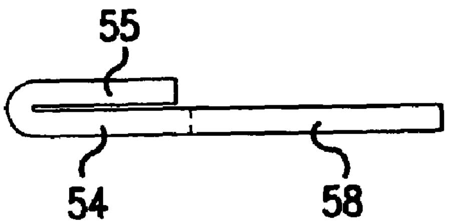
FIG. 7 is a side elevational view of a heatsink element for forming the heatsink of FIG. 1.
Figure 8:
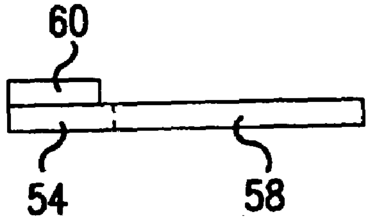
FIG. 8 is a side elevational view of an alternate heatsink element for forming the heatsink of FIG. 1.
Figure 9:
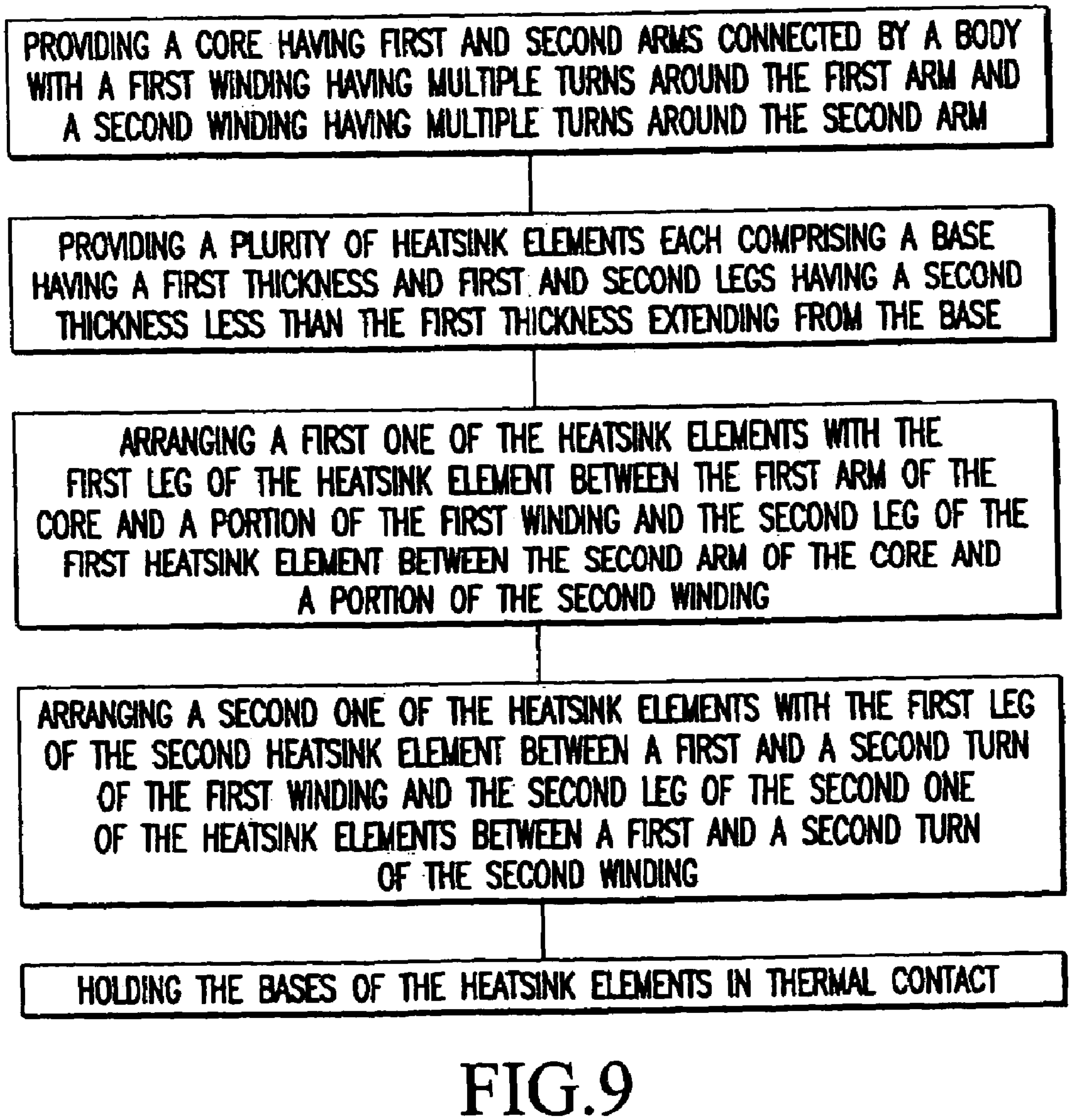
FIG. 9 is a flow chart illustrating a method of cooling an electromagnetic device according to an embodiment of the invention.

Two heatsinks 50 are shown associated with electromagnetic device 10, the individual components of which are best illustrated in FIG. 6. Each heatsink 50 comprises a plurality of U-shaped heatsink elements 52 each has a base 54, a first leg 56 extending from base 54 and a second leg 58 extending from base 54 substantially parallel to first leg 54. First and second legs 56 and 58 are substantially planar and formed from a material having good thermal conductivity, copper or aluminum, for example. Base 54 has a thickness greater than the thickness of the first and second legs 56, 58. This thicker base 54 may be formed in a variety of ways including 1) by folding over a portion 55 of base 54 to create a double thickness of material, as illustrated in FIG. 7 or by attaching a separate spacer member 60 to base 54 to increase its thickness as illustrated in FIG. 8. Each U-shaped element 52 could alternately be formed, forged or cast with a greater thickness in its base portion, but the above two embodiments are generally preferred for their relatively low costs. Each heatsink 50 comprises a plurality of these U-shaped elements 52 stacked with their bases 54 in thermal contact with one another, or with an intervening spacer member 60, and an air gap between adjacent ones of first legs 56 and second legs 58.

Figure 2:
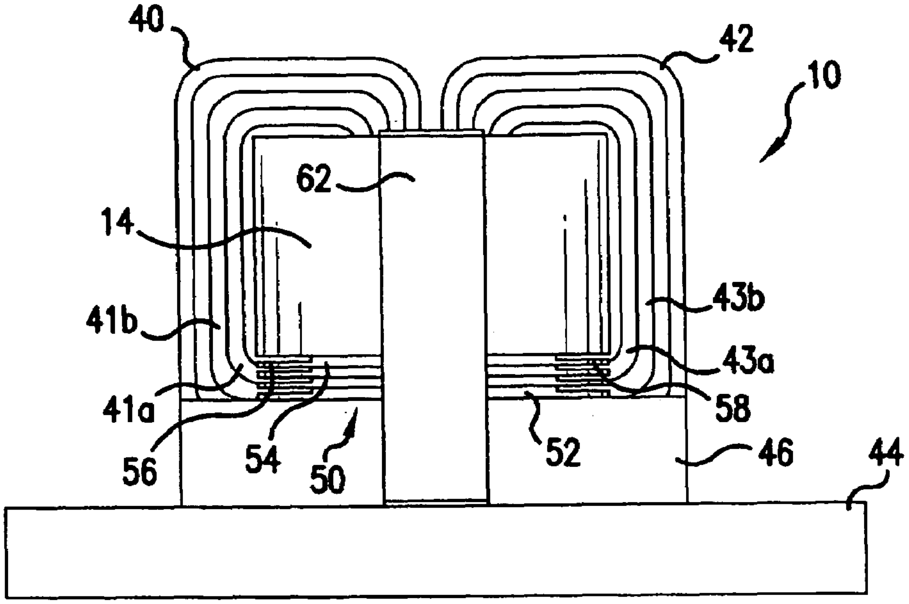
FIG. 2 is a left side elevational view of the electromagnetic device of FIG. 1.
Figure 3:
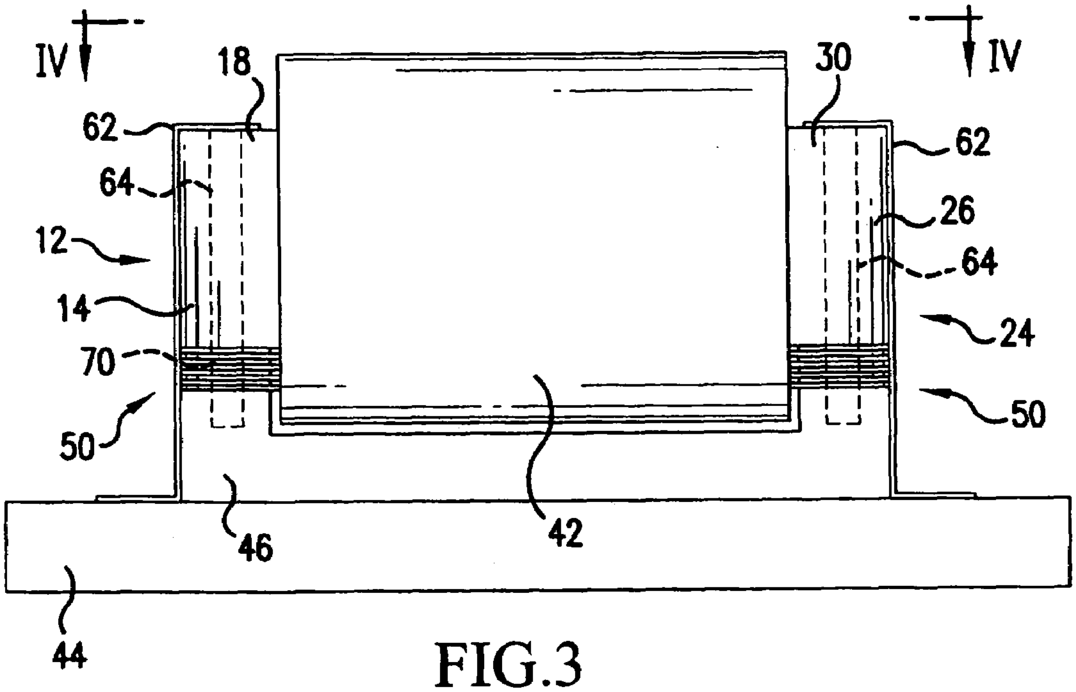
FIG. 3 is a front elevational view of the electromagnetic device of FIG. 1.
Figure 4:
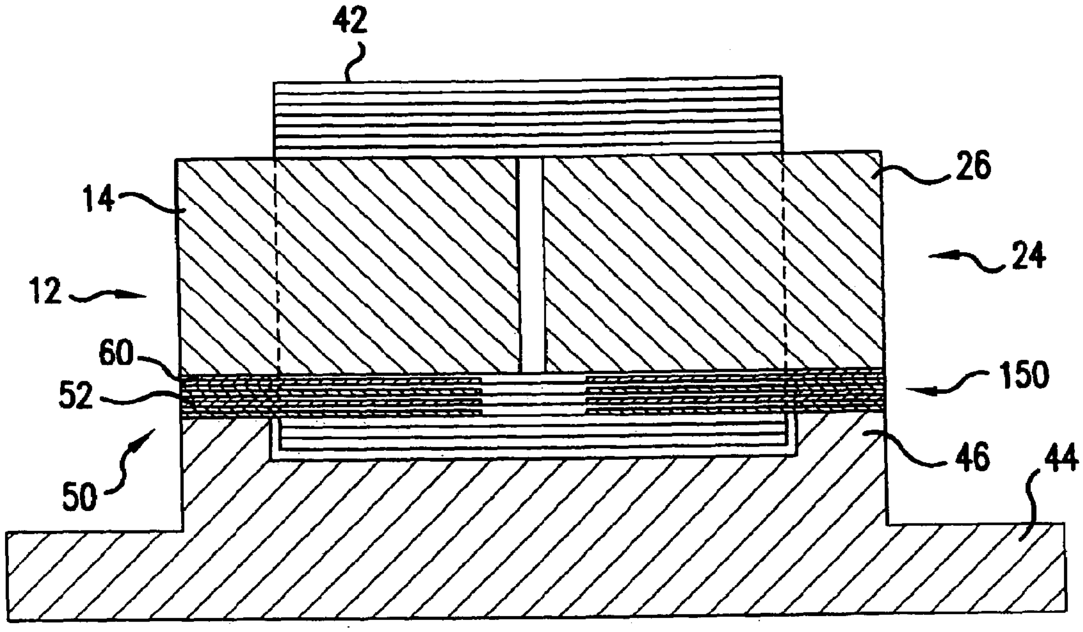
FIG. 4 is a sectional elevational view taken through line IV—IV in FIG. 3.

With reference to FIGS. 2 and 4, first legs 56 of the heatsink elements 52 are adapted to extend between adjacent turns, turns 41*a* and 41*b*, for example, of first winding 40, while second legs 58 extend between adjacent turns, turns 43*a* and 43*b*, for example, of second winding 42. Alternately, the legs 56, 58 may extend between an arm, such as first core first arm 16, and one of the turns adjacent the first core first arm 16, turn 41*a*, for example, adjacent bottom 22 of first core element 12, to conduct heat generated in the windings 40 outwardly from the electromagnetic device 10. The length of the first and second legs 56, 58 may vary, but will generally be approximately the same as the lengths of the corresponding arms of the core element.

The exposed portions of the heatsink elements 52, particularly the bases 54, provide some convective cooling for electromagnetic device 10 as air flows over and past the electromagnetic device 10. However, primary cooling is provided by conductive cooling from heatsinks 50 to base 44. The legs 56, 58 of heatsink elements 52 absorb heat from windings 40, 42 which heat is conducted from legs 56, 58 of the heatsink element 52 to base 54 of each heatsink element 52 and from the bases 54 of adjacent heatsink elements 52 to support 44. When U-shaped heatsink elements 52 having separate spacer elements 60 are used, heat transfers through the spacer elements as well. The spacer elements 60 are also made from a material having good thermal conductivity, and may be connected to bases 54 such as by welding or brazing, for example, or merely stacked therebetween. A thermal grease (not shown) may be used between adjacent heatsink elements 52 to improve heat transfer.

Electromagnetic device 10 is connected to support 44 in any one of a variety of well-known manners. For example, clamps 62 may be provided to secure first core element 12 and second core element 24 to support 44 with a screw 64. Beneficially, clamping first and second core elements 12 and 14 in this manner presses the bases 54 and/or spacer elements 60 of heatsinks 50, 150 more tightly together and improves thermal conduction to support 44. The invention is not limited to any particular device for securing the electromagnetic device 10 to a support, and other arrangements that hold the core elements 12, 24 and heatsink elements 52 against base 44 may be used. Alternately, holes 64 may be provided in first core element 12 and second core element 24 so the core elements 12, 24 can be connected to support 44 using screws 68. Corresponding holes 70 can be provided in the U-shaped heatsink elements 54 aligned with holes 64 so that such drilled cores can be used with heatsink 50. Both methods of securing the electromagnetic device are shown in the figures for illustration purposes; however, normally, only one or the other method of securing the heatsink and electromagnetic device to a support would be used.

Different electromagnetic devices generate different amounts of heat. Beneficially, the modular nature of heatsinks 50 allows these heatsinks to be "tuned" to the particular device 10. For example, an electromagnetic device that generates significant heat in the vicinity of its core may include one or more heatsink elements 52 adjacent the core to remove heat from this area. This may be useful, for example, in conjunction with ceramic core elements that exhibit poor thermal conductivity. Alternately, for example, with metallic cores that conduct heat well, it may only be necessary to provide a heatsink having U-shaped heatsink elements between certain turns of windings 40, 42. Heatsinks 50 having greater or lesser numbers of U-shaped heatsink elements 52 may be selected based on factors such as the size and power level of the electromagnetic device with which the heatsink 50 is to be used, and the amount of cooling required. Furthermore, the standard shape of the heatsink elements can be readily scaled to electromagnetic devices of different sizes. Because the shape of the U-shaped elements corresponds generally to the footprint of the electromagnetic device with which it is used, these heatsinks 50 do not increase the footprint of the device and only slightly change the volume of space occupied by the device. They thus provide effective cooling for a variety of devices under a variety of conditions.

While the present invention has been described in terms of several embodiments, changes and additions to these embodiments will become apparent to those skilled in the art upon a reading of the foregoing description. It is intended that all such obvious modifications and additions form a part of this invention to the extent that they fall within the scope of the several claims appended hereto.

I claim:

1. A heatsink comprising a plurality of U-shaped heatsink elements each comprising first and second legs having a first thickness connected by a base having a second thickness greater than said first thickness, the base of each of said plurality of heatsink elements being in contact with the base of an adjacent heatsink element.

2. The heatsink of claim 1 wherein said first leg of each of said plurality of heatsink elements is spaced from the first leg of an adjacent heatsink element.

3. The heatsink of claim 2 wherein said first legs of said heatsink elements are substantially planar and parallel to one another.

4. The heatsink of claim 1 wherein the first leg of one of said heatsink elements is parallel to the second leg of said one of said heatsink elements.

5. The heatsink of claim 1 including a heat conducting sheet associated with the base of one of said heatsink elements.

6. The heatsink of claim 5 wherein said heatsink and said heat conducting sheet are formed from the same material.

7. The heatsink of claim 1 wherein said base includes a folded portion forming said second thickness.

8. The heatsink of claim 1 wherein the first leg of one of said heatsink elements has a first length and the second leg of said one of said heatsink elements has a second length substantially equal to said first length.

9. The heatsink of claim 1 wherein said first leg extends substantially perpendicularly from said base.

10. The heatsink of claim 9 wherein said heatsink elements are formed from copper or aluminum.

11. A method of cooling an electromagnetic device comprising a core having first and second arms connected by a body with a first winding having multiple turns around said first arm and a second winding having multiple turns around said second arm comprising the steps of:

providing a plurality of heatsink elements each comprising a base having a first thickness and first and second legs having a second thickness less than the first thickness extending from the base, arranging a first one of the heatsink elements with the first leg of the first heatsink element between the first arm of the core and a portion of the first winding and the second leg of the first heatsink element between the second arm of the core and a portion of the second winding;

arranging a second one of the heatsink elements with the first leg of the second heatsink element between a first and a second turn of the first winding and the second leg of the second one of the heatsink elements between a first and a second turn of the second winding; and holding the bases of the heatsink elements in thermal contact.

12. The method of claim 11 including the additional step of holding at least one of the heatsink elements against a secondary heatsink.

13. The method of claim 12 including the additional step of attaching the core to the secondary heatsink.

14. The method of claim 13 wherein said step of attaching the core to the secondary heatsink comprises the step of inserting a fastener though a portion of the core, through at least one of the heatsink elements and into the secondary heatsink.

15. The method of claim 12 including the additional step of arranging a third one of the heatsink elements with the first leg of the third heatsink element between the second and a third turn of the first winding and the second leg of the third heatsink element between the second and a third turn of the second winding.

16. The method of claim 11 wherein said step of arranging a first one of the heatsink elements with the first leg of the first heatsink element between the first arm of the core and a portion of the first winding and the second leg of the first heatsink element between the second arm of the core and a portion of the second winding comprises the step of arranging the first leg of the heatsink element in contact with the first arm of the core.

17. An electromagnetic device comprising a core having first and second arms connected by at least one body, a first winding comprising multiple turns on said first arm and a second winding comprising multiple turns on said second arm, and a heatsink comprising a first plurality of U-shaped heatsink elements each comprising first and second legs aligned with said first and second arms and having a first thickness connected by a base having a second thickness greater than said first thickness, the base of each of said plurality of elements being in contact with the base of an adjacent heatsink element.

18. The electromagnetic device of claim 17 wherein said first legs of said first plurality of heatsink elements are substantially parallel to one another and to said first arm.

19. The electromagnetic device of claim 17 wherein said first arm is substantially parallel to said second arm and the first leg of one of said first plurality of heatsink elements is parallel to the second leg of said one of said first plurality of heatsink elements.

20. The electromagnetic device of claim 17 wherein each heatsink element includes a heat conductive sheet attached to the base of said heatsink element.

21. The electromagnetic device of claim 17 wherein said at least one body comprises first and second bodies and including a second plurality of U-shaped heatsink elements each comprising first and second legs aligned with first and second arms of said second body and having a first thickness connected by a base having a second thickness greater than said first thickness, said bases of said second plurality of heatsink elements being aligned with said second body.

22. The electromagnetic device of claim 17 wherein said at least one body includes a hole, said U-shaped heatsink elements include holes aligned with the hole in the at least one body, and a fastener extending through said body hole and said heatsink element hole and into a secondary heatsink.

23. A heatsink comprising a plurality of U-shaped heatsink elements each comprising first and second legs connected by a base and a plurality of spacers spacing the base of each heatsink element from the base of an adjacent heatsink element and leaving a gap between the first leg of each heatsink element and the first leg of an adjacent heatsink element, the base of each of said plurality of heatsink elements being in thermal contact with the base of each adjacent heatsink element through said spacers.

24. The heatsink of claim 23 wherein said spacer comprises a metallic element connected to said base.

25. The heatsink of claim 23 wherein said spacer comprises a folded portion of said heatsink element.

26. The heatsink of claim 24 wherein each of said metallic elements is connected to at least one heatsink base.

* * * * *